(12) United States Patent
Kang et al.

(10) Patent No.: US 6,759,873 B2
(45) Date of Patent: Jul. 6, 2004

(54) REVERSE BIASING LOGIC CIRCUIT

(75) Inventors: Sung-Mo Kang, Santa Cruz, CA (US);
Seung-Moon Yoo, Austin, TX (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 10/153,158

(22) Filed: May 21, 2002

(65) Prior Publication Data

US 2002/0175710 A1 Nov. 28, 2002

Related U.S. Application Data

(60) Provisional application No. 60/292,570, filed on May 22, 2001.

(51) Int. Cl.[7] .......................................... H03K 19/0185
(52) U.S. Cl. ...................... 326/81; 326/107; 326/108; 326/120; 326/121; 326/95; 326/98; 327/534
(58) Field of Search ............................ 326/93–98, 107, 326/117, 120; 327/208–212

(56) References Cited

U.S. PATENT DOCUMENTS

| | | | | |
|---|---|---|---|---|
| 5,115,150 A | * | 5/1992 | Ludwig | 326/95 |
| 5,151,620 A | | 9/1992 | Lin | 307/475 |
| 5,175,448 A | * | 12/1992 | Fujii | 326/98 |
| 5,880,604 A | | 3/1999 | Kawahara et al. | 326/83 |
| 6,049,245 A | | 4/2000 | Son et al. | 327/544 |
| 6,107,869 A | | 8/2000 | Horiguchi et al. | 327/544 |
| 6,191,615 B1 | | 2/2001 | Koga | 326/81 |
| 6,204,696 B1 | * | 3/2001 | Krishnamurthy et al. | 326/98 |
| 6,404,269 B1 | | 6/2002 | Voldman | 327/534 |
| 6,411,157 B1 | | 6/2002 | Hsu et al. | 327/536 |
| 6,492,837 B1 | * | 12/2002 | Narendra et al. | 326/95 |

OTHER PUBLICATIONS

Mark N. Horenstein, Microelectronic Circuits & Devices, 1996, pp. 240–250.*
S. M. Yoo and S. M. Kang, "New High Performance Sub–1V Circuit Technique with Reduced Standby Current and Robust Data Holding," *IEEE International Symposium on Circuits and Systems*, May 28–31, 2000.
S. M. Yoo and S. M. Kang, "Techcon 2000 New Sub–1V Circuit Techniques for High Performance, Reduced Standby Current and Robust Data Holding," Sep. 22, 2000.
T. Iwata, H. Yamauchi, H. Akamatsu, Y. Terada and A. Matsuzawa, "SA 17.3: Gate–Over–Driving CMOS Architecture for 0.5 V Single–Power–Supply–Operated Devices," *IEEE International Solid–State Conference*, 1997.
S. Shigematsu, S. Mutoh, Y. Matsuya, Y. Tanabe and J. Yamada, "A 1–V High–Speed MTCMOS Circuit Scheme for Power–Down Application Circuits," *IEEE J. of Solid–State Circuits*, vol. 32, No. 6, pp. 861–869, Jun. 1997.

(List continued on next page.)

*Primary Examiner*—Vibol Tan
(74) *Attorney, Agent, or Firm*—Greer, Burns & Crain, Ltd.

(57) ABSTRACT

A reverse biasing logic circuit is disclosed for limiting standby leakage electric current losses during circuit operation. The circuit includes a logic function circuit having one or more logic transistors that receive an input and perform a logic function operation to generate an output. A power source transistor connects to the logic function circuit and receives a control signal that changes node voltages of the one or more logic transistors between an active mode and a standby mode. During the standby mode, the power source transistor causes reverse biasing of at least one of the one or more logic transistors which prevents a leakage electric current flow between the power source transistor and the one or more logic transistors.

25 Claims, 2 Drawing Sheets

OTHER PUBLICATIONS

S. Mutoh, T. Douseki, Y. Matsuya, T. Aoki, S. Shigematsu and J. Yamada, "1–V Power Supply High–Speed Digital Circuit Technology with Multithreshold–Voltage CMOS," *IEEE J. of Solid–State Circuits*, vol. 30, No. 8, pp. 847–854, Aug, 1995.

T. Kuroda, T. Fujita, S. Mita, T. Nagamatu, S. Yoshioka, F. Sano, M. Norishima, M. Murota, M. Kako, M. Kinugawa, M. Kakumu and T. Sakurai, "FA10.3: A0.9V 150 MHz 10mW 4mm$^2$ 2–D Discrete Closing Transform Core Processor with Variable–Threshold–Voltage Scheme," *Digest of Technical Papers*, Feb. 9, 1996.

K. Seta, H. Hara, T. Kuroda, M. Kakumu and T. Sakurai, "FP 19.4: 50% Active–Power Saving without Speed Degradation Using Standby Power Reduction (SPR) Circuit," *IEEE International Solid State Circuits Conference*, 1995.

F. Assaderaghi, D. Sinitsky, S. Parke, J. Bokor, P. K. Ko, and C. Hu, A Dynamic Threshold Voltage MOSFET (DTMOS) for Ultra–Low Voltage Operation, *IEEE J. of Solid State Circuits*, pp. 809–812, 1994.

M. Horiguchi, T. Sakata, K. Itoh, "Switched–Source Impedance CMOS Circuit for Low Standby Subthreshold Current Giga–Scale LSI's ," *IEEE J. of Solid–State Circuits*, vol. 28, No. 11, pp. 1131–1153, Nov., 1993.

J. Burr and J. Scott, "A 200m V Self–Testing Encoder/Decoder using Stanford Ultra–Low–Power CMOS", *ISSCC Digest of Technical Papers*, pp. 84–85, Feb. 1994.

Kawaguchi et al., "A CMOS Scheme for 0.5V Supply Voltage with Pico–Ampere Standby Current", *ISSCC Digest of Technical Papers*, pp. 192–193, Feb. 1998.

Amendm nt for the U.S. patent application 10/155,490, Kang et al., filed Jul. 21, 2003, 31 pgs.

* cited by examiner

REVERSE BIASING LOGIC CIRCUIT

CROSS-REFERENCE TO RELATED APPLICATIONS

The present Application claims priority under Title 35 U.S.C. §119 on copending Provisional Patent Application Serial No. 60/292,570, filed May 22, 2001.

FIELD OF THE INVENTION

The field of the invention is integrated logic circuits. The invention finds particular use in microprocessor, ASIC, and DSP circuits.

BACKGROUND OF THE INVENTION

Power consumption and device reliability are of increasing concern in densely integrated circuits and systems, such as those used with portable electronics. In particular, as the power supply voltage in CMOS systems is continually scaled down to less than one volt for newer integrated circuit applications, performance degradation of the integrated circuits within these CMOS systems occurs. CMOS systems experience performance degradation because of reduced gate to source transistor voltages ($V_{GS}$) in the integrated circuit as well as an increase of the standby current due to scaled threshold voltages ($V_t$) of the integrated circuit transistors.

Various circuit techniques have been proposed to overcome performance degradation as well as other problems caused by reduced supply voltages in a sub-threshold region below 1V being fed to the integrated circuits of CMOS systems. More specifically, MOS parameters such as threshold voltages, gate voltages, and source voltages of the integrated circuit transistors have been controlled to reduce performance degradation. While these methods have overcome some of the performance degradation problems, each of these methods has drawbacks when implemented in a sub-threshold region.

The methods implementing threshold voltage control use MOS transistors with different threshold voltages. These methods improve performance by employing low $V_t$ transistors in the active mode of the integrated circuit, and employing high $V_t$ transistors in the standby mode to reduce standby leakage current. Such methods directed to MOS threshold voltage control were addressed by S. M. Muto et al., "1-V Power Supply High-Speed Digital Circuit Technology with Multi-Threshold-Voltage CMOS," IEEE (Pub. No. 30 (8): 847–854).

FIG. 1 shows a multi-threshold CMOS circuit design suggested by S. M. Muto et al. and is generally designated 4. The circuit 4 provides a plurality of transistors 6 with different threshold voltages. Improved performance during active mode of the circuit 4 is accomplished by using low $V_t$ transistors and a low threshold voltage NAND gate 8. Leakage current is reduced during standby mode by using high $V_t$ transistors (Q1, Q2). A drawback of using this type of circuit design, however, is that large transistor sizes for Q1 and Q2 are required to meet performance requirements in the sub-threshold region. Moreover, since the virtual power lines (VDDV, GNDV) float in standby mode, a special data holding circuit is required to preserve data safely.

Other known threshold voltage control methods vary the substrate bias voltages to control $V_t$. In these methods, different substrate bias voltages are applied by a self substrate bias generator to provide a low $V_t$ while the integrated circuit is in an active mode and a high $V_t$ while the circuit is in a standby mode. These methods, however, also have drawbacks. Some methods require a large voltage to change $V_t$ by a few hundred mV since $V_t$ is proportional to the square root of the transistor source to substrate voltage. Other methods have problems due to the need for a triple well structure and/or power lines for well bias. Moreover, in some methods there is generally a slow response time to well bias change. Further, other substrate bias control methods employing dynamic $V_t$ according to an input state have also been found to be unsatisfactory because of an increased leakage electric current loss due to the inherent forward bias electric current of pn-junctions.

Gate control voltage methods propose reducing the leakage current flowing through the power source transistor Q1 of FIG. 1 by using an on-chip boost voltage for the control signal (SL). These methods provide control signal voltages that enable transistor Q1 to be reverse biased in the standby mode to suppress the leakage electric current. A drawback of using such methods is that they need N-well separation and a high efficient on-chip boost voltage generator to perform, which is difficult to achieve in the sub-threshold region. Oxide reliability, as well as lost logic state information while the circuit is in the standby mode are further drawbacks to using these methods, especially since additional circuitry is required for holding data. Source voltage control schemes also incur some of the drawbacks discussed herein related to a limitation of the low supply voltage, requirement of a complicated data holding scheme and/or on-chip boost voltage generator, and gate oxide reliability.

SUMMARY OF THE INVENTION

A reverse biasing circuit is provided which limits standby leakage electric current losses by reverse biasing transistors during a standby mode of a logic function sub-circuit of the reverse biasing circuit. The logic function circuit includes one or more logic transistors, and receives an input which is processed to generate an output. A power source transistor connects to the logic function circuit and receives a control signal that enables the logic function circuit to switch between an active mode and a standby mode. In the standby mode, a gate to source biasing of the power source transistor causes reverse biasing of the power source transistor and at least one of the one or more logic transistors which prevents a leakage electric current flow between the power source transistor and the logic function circuit.

DETAILED DESCRIPTION OF THE PREFERRED EMBODIMENTS

As integrated circuit chip designs become more complex, new designs incorporating integrated circuits with reduced power dissipation in a sub-threshold region are desired. For many of the current chip designs, a scaling down of the supply voltage below 1V to the sub-threshold region will result in a performance degradation of the integrated circuit.

Thus, it is advantageous to have a technique for forming integrated circuits, and preferably CMOS integrated circuits, to operate in the sub-threshold region and further provides integrated circuits having reduced power consumption. In particular, an advantage of the disclosed CMOS circuit designs are that a reverse biasing of transistors in the circuit suppresses leakage electric current without degrading performance of the circuit.

Figure 1:
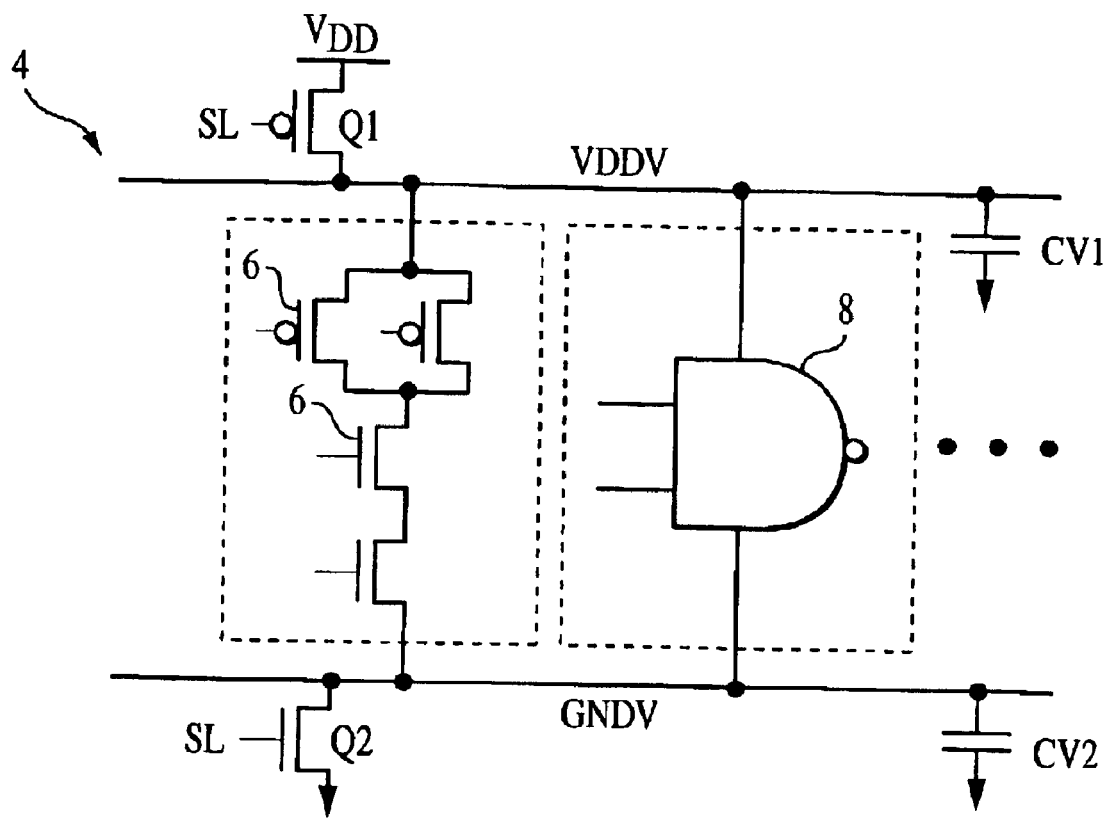
FIG. 1 shows a conventional multi-threshold CMOS circuit implementing a threshold voltage control method.
Figure 2:
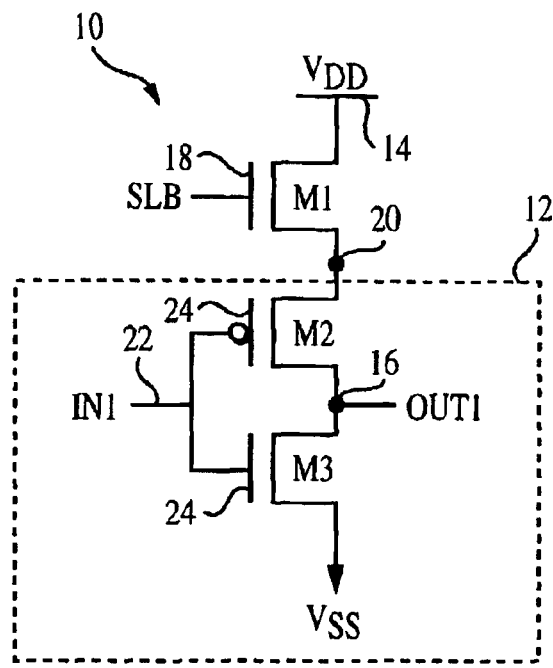
FIG. 2 illustrates a preferred embodiment CMOS reverse biasing circuit with an inverter as the logic function circuit.

FIG. 2 illustrates a preferred embodiment CMOS reverse biasing circuit 10 having an inverter as a logic function circuit 12 connected to an NMOS power source transistor M1. The logic function circuit 12 has an PMOS transistor M2 cascaded with an NMOS transistor M3. Transistors M1, M2, M3 are configured to suppress leakage electric current from a power source (not shown) supplying a voltage $V_{DD}$ at a node 14 of transistor M1 to an output (OUT1) provided at a node 16 between transistors M2 and M3. The logic function circuit 12 also receives an input (IN1) which is processed by the logic function circuit to generate the output OUT1. Since the logic function circuit 12 is an inverter, a "Hi" voltage input at IN1 is processed as a "Lo" voltage output at OUT1, and a "Lo" voltage input at IN1 is processed as a "Hi" voltage output at OUT1, as is known to those skilled in the art of integrated circuit design. In a preferred embodiment, transistor M1 is a depletion transistor and transistors M2, M3 are enhancement transistors.

Other embodiments having different combinations of transistors M1, M2, and M3 as depletion/enhancement transistors to form the CMOS reverse biasing circuit 10 are contemplated and within the scope of the present invention. Additionally, the logic function circuit 12 can be other types of logic gates, such as AND, OR, NOR, and NAND gates. Alternatively, the logic function circuit 12 can be a single transistor or more complex logic expressions combining multiple logic gates and/or transistors.

In general, the logic function circuit 12 includes one or more logic transistors that evaluate the input IN1 to the logic function circuit while the logic function circuit is in an active mode, and maintain the output OUT1 while the logic function circuit is in a standby mode. During the standby mode, voltages at nodes of the logic function circuit 12 and the power source transistor Ml ensure that both the transistor Ml and at least one of the one or more logic transistors are reverse biased. This reverse biasing of the power source transistor M1 and at least one of the one or more logic transistors prevents a flow of leakage electric current into the logic function circuit.

In the active mode, an external control signal (SLB) provided at a gate 18 of the power source transistor M1 of the CMOS reverse biasing circuit 10 is at a "Hi" voltage, such as a 1V voltage. The control signal SLB is configured to switch between a "Lo" voltage, such as a 0V voltage, and the "Hi" voltage or vice-versa to initiate a standby mode or the active mode of the logic function circuit 12. The transistor M1 is turned on enabling electric current flow between a source node 20 and the drain node 14 of the transistor M1. That is, in the active mode the drain node 14 provides electric current to charge the source node 20 to a $V_{DD}$ voltage. Since the transistor M1 is preferably a depletion transistor, the logic function 12 is evaluated in full strength without any performance degradation due to the increased gate to source voltage $|V_{GS}|$ of the depletion transistor.

In the standby mode, the control signal SLB of the CMOS reverse biasing circuit 10 goes to a "Lo" voltage. During this mode, voltages at the nodes of the logic function circuit 12 ensure that at least one of the one or more logic transistors is reverse biased to prevent a flow of electric current into the logic function circuit. For a "Hi" input IN1 at a node 22 which feeds gates 24 of the transistors M2, M3, the PMOS transistor M2 is turned off due to a gate to source voltage equal to 0V, and the NMOS transistor M3 is turned on. Transistor M1 is also turned off, and has gate to source ($V_{GS}$) and gate to drain ($V_{GD}$) voltages that are reversed biased by the magnitude of transistor M1's power supply $V_{DD}$. Since the leakage electric current of transistor M2 is larger than the leakage electric current of transistor M1 due to the bias conditions at each of the nodes of the transistors M1, M2, the voltage at the source node 20 is reduced by a $\Delta V_1$ voltage. The $V_{GS}$ and $V_{GD}$ voltages of transistor M1 are now $-V_{DD}+\Delta V_1$ and $-V_{DD}$, respectively. The transistor M2 has a $V_{GS}=\Delta V_1$, and a $V_{GD}=V_{DD}$. Thus, transistors M1 and M2 are reverse biased enabling the leakage current flowing from $V_{DD}$ to the logic circuit 12 to be suppressed while the voltage at the output node 16 is maintained "Lo" by transistor M3.

In operation, the CMOS reverse biasing circuit 10 and other alternative reverse biasing circuits implementing the techniques described herein provide a method of limiting a leakage electric current flow in various logic function circuits that have at least one logic transistor. The method provides for energizing a power source transistor, such as transistor Ml, wherein the power source transistor is connected to at least one logic transistor of a logic function circuit. The CMOS logic circuit receives a control signal at a gate of the power source transistor to transform the logic function circuit between an active mode and a standby mode, wherein an input provided to the logic circuit is evaluated in the active mode to generate an output in the standby mode. Moreover, in the standby mode, power source transistor M1 and one or more of the at least one logic transistors are reverse biased to prevent a flow of an electric current between the logic function circuit and the power source transistor. In addition, a further step of maintaining the output signal in the standby mode can be implemented by connecting additional storage devices, such as parallel connected transistors, to the output node 16.

Figure 3:
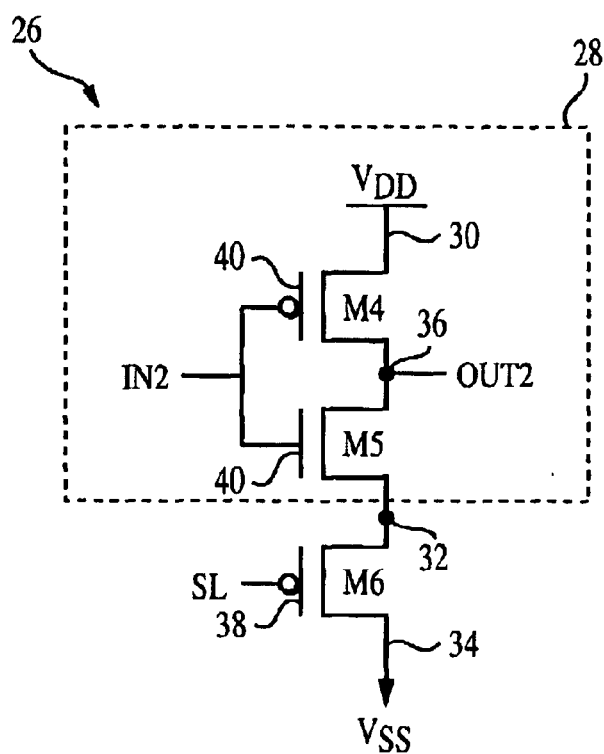
FIG. 3 illustrates an alternative embodiment CMOS reverse biasing circuit with an inverter as the logic function circuit.

FIG. 3 illustrates an alternative embodiment CMOS reverse biasing circuit 26 similar to the circuit of FIG. 3 with an inverter again provided as a logic function circuit 28. The logic function circuit 28 includes an PMOS transistor M4 that receives a voltage $V_{DD}$ at a node 30 and an NMOS transistor M5 which is cascaded with the PMOS transistor M4. An PMOS transistor M6 connects at a node 32 to the logic function circuit 28 and has a power source ($V_{SS}$) connected at a node 34. The transistors M4, M5, and M6 suppress leakage electric current from a node 36 providing an output (OUT2) of the CMOS reverse biasing circuit 26 to the power source $V_{SS}$ supplied at the node 34. In a preferred embodiment, transistor M6 is a depletion transistor and transistors M4, M5 are enhancement transistors.

Other embodiments having different combinations of transistors M4, M5, and M6 as depletion/enhancement transistors to form the CMOS reverse biasing circuit 26 are contemplated and within the scope of the present invention. Additionally, the logic function circuit 28 can be other types of logic gates, such as AND, OR, NOR, and NAND gates. Alternatively, the logic function circuit 28 can be a single transistor or more complex logic expressions combining multiple logic gates and/or transistors.

In an active mode, an external control signal (SL) provided at a gate 38 of the PMOS transistor M6 of the CMOS reverse biasing circuit 26 is at a "Lo" voltage. The PMOS transistor M6 is turned on enabling electric current flow between the source 32 and the drain 34 of the transistor. Since the PMOS transistor M6 is preferably a depletion transistor, the logic function circuit 28 is evaluated in full strength without any performance degradation due to any increased gate to source voltages $|V_{GS}|$ of the transistors.

In a standby mode, the control signal SL of the CMOS reverse biasing circuit 26 goes to a "Hi" voltage. During this mode, voltages at the nodes of the logic function circuit 28 ensure that the power source transistor M6 and at least one of the one or more logic transistors are reverse biased to prevent a flow of electric current out of the logic function circuit to the power source $V_{ss}$. For a "Lo" input (IN 2) to the gates 40 of the transistors M4, M5, the NMOS transistor M5 is turned off due to a gate to source voltage equal to 0V, and the PMOS transistor M4 is turned on. The PMOS transistor M6 is also turned off, and has $V_{GS}$ and $V_{GD}$ voltages that are reversed biased by the magnitude of transistor M4's power supply $V_{DD}$. Since the leakage electric current of the NMOS transistor M5 is larger than the leakage electric current of the PMOS transistor M6 due to the bias conditions at each of the nodes of the transistors M5, M6, the voltage at the node 32 is increased by a $\Delta V_2$ voltage. The $V_{GS}$ and $V_{GD}$ voltages of the transistor M6 are now $+V_{DD}-\Delta V_2$ and $V_{DD}$, respectively. Furthermore, the transistor M5 has a $V_{GS}=-\Delta V_2$, and a $V_{GD}-=V_{DD}$. Thus, transistors M5, M6 are reverse biased enabling the leakage electric current flowing from the output node 36 to the power supply $V_{SS}$ of transistor M6 to be suppressed while the voltage at the output node is maintained "Hi" by the PMOS transistor M4.

In other alternative embodiments, more than one power source transistor can connect to the logic function circuits 12, 28. In addition, if the logic function circuits 12, 28 comprise at least two logic transistors, then the logic function transistors may be configured to be selectively connected to a power source transistor, or alternatively selectively connected to multiple power source transistors. Such selection will depend on the desired operation to be performed by the logic function circuit and the selected CMOS reverse biasing circuit, which may include memory storage transistors or other storage circuits for maintaining output data values of the logic function circuit. Moreover, selectively connecting the logic function transistors to the power source transistors enables the leakage electric current to be selectively controlled.

While a specific embodiment of the present invention has been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

What is claimed is:

1. A reverse biasing circuit comprising: a logic function circuit having one or more logic transistors to operate in an active mode and a standby mode in response to a control signal, wherein the control signal is other than a clock signal; and a power source transistor that is reversed biased in response to the control signal in the standby mode to reverse bias at least one of the one or more logic transistors to prevent an electric current flow between the logic function circuit and the power source transistor.

2. The reverse biasing circuit of claim 1, wherein the control signal causes a source node of the power source transistor to be charged to a high voltage to reverse bias a logic transistor.

3. The reverse biasing circuit of claim 1, wherein the logic function includes two cascaded transistors, and wherein only one of the two cascaded transistors are reversed biased in the standby mode.

4. The reverse biasing circuit of claim 3, wherein the two cascaded transistors comprise an PMOS transistor and an NMOS transistor.

5. The reverse biasing circuit of claim 1, wherein the logic function circuit comprises at least two logic transistors, and wherein each of the at least two logic transistors are selectively connectable to the power source transistor.

6. The reverse biasing circuit of claim 4, wherein the NMOS transistor has a node connected to the power source transistor.

7. The reverse biasing circuit of claim 1, wherein the power source transistor is a depletion transistor.

8. The reverse biasing circuit of claim 1, wherein the one or more logic transistors are enhancement transistors.

9. The reverse biasing circuit of claim 1, wherein the control signal has one of a high voltage and a low voltage in the active mode and the reverse biasing circuit is an CMOS reverse biasing circuit.

10. The reverse biasing circuit of claim 1, wherein the control signal causes a source node of the power source transistor to be discharged to a low voltage to reverse bias a logic transistor.

11. The reverse biasing circuit of claim 4, wherein the PMOS transistor has a node connected to the power source transistor.

12. A method of limiting a leakage electric current flow in a logic circuit having one or more logic transistors, the method comprising the steps of: energizing a power source transistor connected to the logic circuit; receiving an input to the one or more logic transistors; and receiving a control signal at a gate of the power source transistor to reverse bias the power source transistor and the one or more logic transistors of the logic circuit, wherein the control signal transforms the logic circuit between an active mode evaluating the input, and a standby mode providing an output and preventing a flow of electric current between the logic circuit and the power source transistor, and wherein the control signal is other than a clock signal.

13. The method of claim 12, further comprising the step of maintaining a voltage of the output while the logic circuit is in the standby mode.

14. The method of claim 13, wherein the power source transistor is selectively connected to the one or more logic transistors.

15. The method of claim 12, wherein the logic circuit includes an PMOS transistor and an NMOS transistor.

16. The method of claim 12, wherein the control signal is at a high voltage in the active mode and at a low voltage in the standby mode.

17. The method of claim 12, wherein the control signal is at a low voltage in the active mode and at a high voltage in the standby mode.

18. The method of claim 12, wherein the power source transistor is a depletion transistor.

19. A logic configuration comprising: one or more logic transistors receiving an input signal, wherein the input signal is other than a clock signal; and means for reverse biasing at least one of the one or more logic transistors to prevent one of a flow of electric current into and a flow of electric current out of the one or more logic transistors.

20. The logic configuration of claim 19, wherein the means for reverse biasing comprises a power source transistor connected to at least one of the one or more logic transistors.

21. The logic configuration of claim 19, wherein the one or more logic transistors comprises a plurality of logic transistors, and wherein the means for reverse biasing comprises a power source transistor selectively connected to the plurality of logic transistors.

22. The logic configuration of claim 20, wherein the power source transistor is a depletion transistor and the one or more logic transistors are enhancement transistors.

23. The logic configuration of claim 21, wherein the one or more logic transistors are reversed biased upon the power source transistor receiving one of a high voltage signal and a low voltage signal.

24. The reverse biased circuit of claim 1, wherein the power source transistor is an PMOS transistor.

25. The reverse biasing circuit of claim 1, wherein the power source transistor is an NMOS transistor.

* * * * *

UNITED STATES PATENT AND TRADEMARK OFFICE
CERTIFICATE OF CORRECTION

PATENT NO. : 6,759,873 B2
DATED : July 6, 2004
INVENTOR(S) : Kang et al.

It is certified that error appears in the above-identified patent and that said Letters Patent is hereby corrected as shown below:

Column 5,
Line 24, delete "$V_{GD^-} = V_{DD}$" and insert -- $V_{GD} = -V_{DD}$ --

Signed and Sealed this

Fifteenth Day of February, 2005

JON W. DUDAS
*Director of the United States Patent and Trademark Office*